US008798948B2

(12) United States Patent
Shimizu

(10) Patent No.: US 8,798,948 B2
(45) Date of Patent: Aug. 5, 2014

(54) MAGNETIC EXCHANGE COUPLING ENERGY CALCULATING METHOD AND APPARATUS

(75) Inventor: Koichi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 267 days.

(21) Appl. No.: 13/067,245

(22) Filed: May 18, 2011

(65) Prior Publication Data

US 2012/0029849 A1    Feb. 2, 2012

(30) Foreign Application Priority Data

Aug. 2, 2010    (JP) .................................. 2010-174011

(51) Int. Cl.
*G01R 15/00* (2006.01)
*G01R 33/12* (2006.01)
*G01R 33/00* (2006.01)

(52) U.S. Cl.
CPC ............ *G01R 33/00* (2013.01); *G01R 33/1215* (2013.01)
USPC .............................. 702/66; 702/115; 702/112

(58) Field of Classification Search
CPC .............. G01R 33/1207; G06T 11/005; G01F 17/5036
USPC .............................. 702/57, 115, 66, 112, 124
See application file for complete search history.

(56) References Cited

U.S. PATENT DOCUMENTS

| 7,058,527 | B2 | 6/2006 | Shimizu | |
| 7,236,899 | B1* | 6/2007 | Shimizu | 702/66 |
| 2002/0040466 | A1* | 4/2002 | Khazei | 716/9 |
| 2005/0075818 | A1* | 4/2005 | Shimizu | 702/115 |
| 2007/0038410 | A1* | 2/2007 | Tunay | 702/150 |
| 2010/0142823 | A1* | 6/2010 | Wang et al. | 382/195 |
| 2010/0322514 | A1* | 12/2010 | Koehler | 382/173 |

FOREIGN PATENT DOCUMENTS

| JP | 2004-219178 | 8/2004 |
| JP | 2004-347482 | 12/2004 |
| JP | 2005-043340 | 2/2005 |
| JP | 2005-100067 | 4/2005 |

OTHER PUBLICATIONS

D. Newns, "Efficient Techniques for the Computer Simulation of Magnetic Recording in Complex Layered Materials", Mar. 15, 2004, Journal of Applied Physics, vol. 95 No. 6, p. 3175-3201.*
Dennis Newns et al., "Efficient techniques for the computer stimulation of magnetic recording in complex layered materials", Journal of Applied Physics, American Institute of Physics, New York, US, vol. 95, No. 6, Mar. 15, 2004, pp. 3175-3201.
H. Kronmuller et al., "Micromagnetism and the microstructure in nanocrystalline materials", Journal of Magnetism and Magnetic Materials, Elsevier Science Publishers, Amsterdam, NL, vol. 175, No. 1-2, Nov. 1, 1997, pp. 177-192.
European Search Report dated Sep. 26, 2011 in corresponding European Patent Application 11167357.0.

* cited by examiner

*Primary Examiner* — John Breene
*Assistant Examiner* — Stephanie Bloss
(74) *Attorney, Agent, or Firm* — Staas & Halsey LLP

(57) ABSTRACT

A non-transitory computer-readable recording medium stores a magnetic program causing a computer to perform an exchange coupling energy calculating process including interpolating a rotation angle between two magnetization vectors disposed at the respective centers of two adjacent elements used in a finite volume method with reference to a rotation axis perpendicular to the two magnetization vectors, and calculating a magnetic exchange coupling field by integrating a magnetic field acting as a force exerted on the two magnetization vectors with the interpolated rotation angle.

16 Claims, 11 Drawing Sheets

N DIVISIONS (N=1,2,···)

MAGNETIC EXCHANGE COUPLING ENERGY CALCULATING METHOD AND APPARATUS

CROSS-REFERENCE TO RELATED APPLICATIONS

This application is based upon and claims the benefit of priority of Japanese Patent Application 2010-174011, filed on Aug. 2, 2010, the entire contents of which are incorporated herein by reference.

FIELD

An embodiment of the invention discussed herein relates to a magnetic exchange coupling energy calculating method and apparatus.

BACKGROUND

According to the related art, an apparatus calculates an average magnetic flux density and an average magnetic field in an equivalent element occupied by plural substances including a magnetic material, and analyzes an electromagnetic field produced in a area larger than the equivalent element based on the calculated average magnetic flux density and average magnetic field. A system is also known in which a target area for electromagnetic field analysis is divided into micro-areas, and an H-B curve and a W-B curve each having a ratio α of the minimum magnetic flux density to the maximum magnetic flux density in the micro-areas as a parameter are stored in a data base in order to perform analysis of an electromagnetic field.

In another apparatus according to the related art, the structure of a magnetic domain, which is an area in which the directions of magnetic moments of atoms are oriented in the same direction, in a magnetic material is varied in a stepwise manner. The apparatus calculates the magnetic energy of the magnetic material in each step, and determines the step in which the magnetic energy is minimized. A technology is also known by which micro-magnetization analysis is performed by taking into consideration magnetic properties, such as magnetic anisotropy, in accordance with a program.

Micro-magnetization analysis refers to a technique for modeling a magnetic material, such as a magnetic head of a HDD (Hard Disk Drive), as a collection of small magnets, as illustrated in FIG. 1, in order to simulate the state of magnetic domains numerically. "Micro-magnetization" refers to an individual small magnet or magnetic material element. In micro-magnetization analysis, a mesh of about 10 nm may be used instead of a mesh of a size corresponding to the actual atomic-size order, from the viewpoint of calculation cost. In a typical mesh size (such as 10 nm or less), the magnetization vectors in adjacent mesh areas may form angles of 5° or less, so that the angles may be considered to be substantially continuous.

The motion of micro-magnetization is governed by a governing equation referred to as the LLG (Landau-Lifshitz-Gilbert) equation, as illustrated below:

$$\frac{\partial \vec{M}}{\partial t} = -\gamma \vec{M} \times \vec{H}_{eff} + \alpha \left( \vec{M} \times \frac{\partial \vec{M}}{\partial t} \right) \quad (1)$$

where M, γ, α, and $H_{eff}$ are a magnetization vector, a magnetic rotation ratio, a frictional coefficient, and an effective magnetic field, respectively.

The effective magnetic field $H_{eff}$ is a composition of plural magnetic field vectors, as indicated by Equation (2) below. The magnetic fields to which the micro-magnetization is subject include an external magnetic field $H_{out}$, a demagnetizing field $H_{demag}$, an anisotropic magnetic field $H_{an}$, and a magnetic exchange coupling field $H_{ex}$.

$$\vec{H}_{eff} = \vec{H}_{out} + \vec{H}_{demag} + \vec{H}_{an} + \vec{H}_{ex} \quad (2)$$

The magnetic exchange coupling field $H_{ex}$ exerts a force that originally acts between adjacent atoms. In order to perform micro-magnetization analysis by using an analysis model in which the size of the mesh is larger than the interatomic distance while maintaining calculation accuracy, an analysis model may be adopted in which the size of the mesh is so small (such as 10 nm or less) that the angles of adjacent magnetization vectors vary by 10 degrees or less.

Micro-magnetization analysis has been mainly used for small amounts of magnetic material of micron order as an analysis target. However, due to advances in computing technology, it is now possible to apply micro-magnetization analysis for magnetic materials of several dozen micron order. It is expected that magnetic material areas of even greater sizes, such as those of motors and transformers, will be selected as analysis targets.

Patent Document 1: Japanese Laid-open Patent Publication No. 2005-43340
Patent Document 2: Japanese Laid-open Patent Publication No. 2004-347482
Patent Document 3: Japanese Laid-open Patent Publication No. 2004-219178
Patent Document 4: Japanese Laid-open Patent Publication No. 2005-100067

Thus, the mesh size may preferably be 10 nm or less in order to enable highly accurate micro-magnetization analysis. As the size of the analysis target area is increased, the number of meshes (which may be hereafter referred to as the number of mesh areas) that need to be handled increases. An increase in mesh size decreases the degrees of freedom required for calculation, so that calculation time can be reduced. However, when the mesh size is increased, the adjacent magnetization vectors may form an angle of more than 10°. Thus, simply increasing the mesh size may result in a decrease in calculation accuracy.

Further, in a micro-magnetization analysis according to related art, an increase in mesh size (such as more than 10 nm) results in an increase in the rotation angle of the magnetization vectors (angle formed by adjacent magnetization vectors), thus preventing accurate micro-magnetization analysis. Specifically, the accuracy of calculation of the magnetic exchange coupling energy or the magnetic exchange coupling field may be lowered.

The object and advantages of the disclosure will be realized and attained by means of the elements and combinations particularly pointed out in the claims.

It is to be understood that both the foregoing general description and the following detailed description are exemplary and explanatory and are not restrictive of the invention, as claimed.

SUMMARY

According to an aspect of the invention, a non-transitory computer-readable recording medium stores a program causing a computer to perform a magnetic exchange coupling energy calculating process including interpolating a rotation angle between two magnetization vectors disposed at the respective centers of two adjacent elements used in a finite volume method with reference to a rotation axis perpendicular to the two magnetization vectors, and calculating a magnetic exchange coupling field by integrating a magnetic field acting as a force exerted on the two magnetization vectors with the interpolated rotation angle.

DESCRIPTION OF EMBODIMENTS

Figure 1:
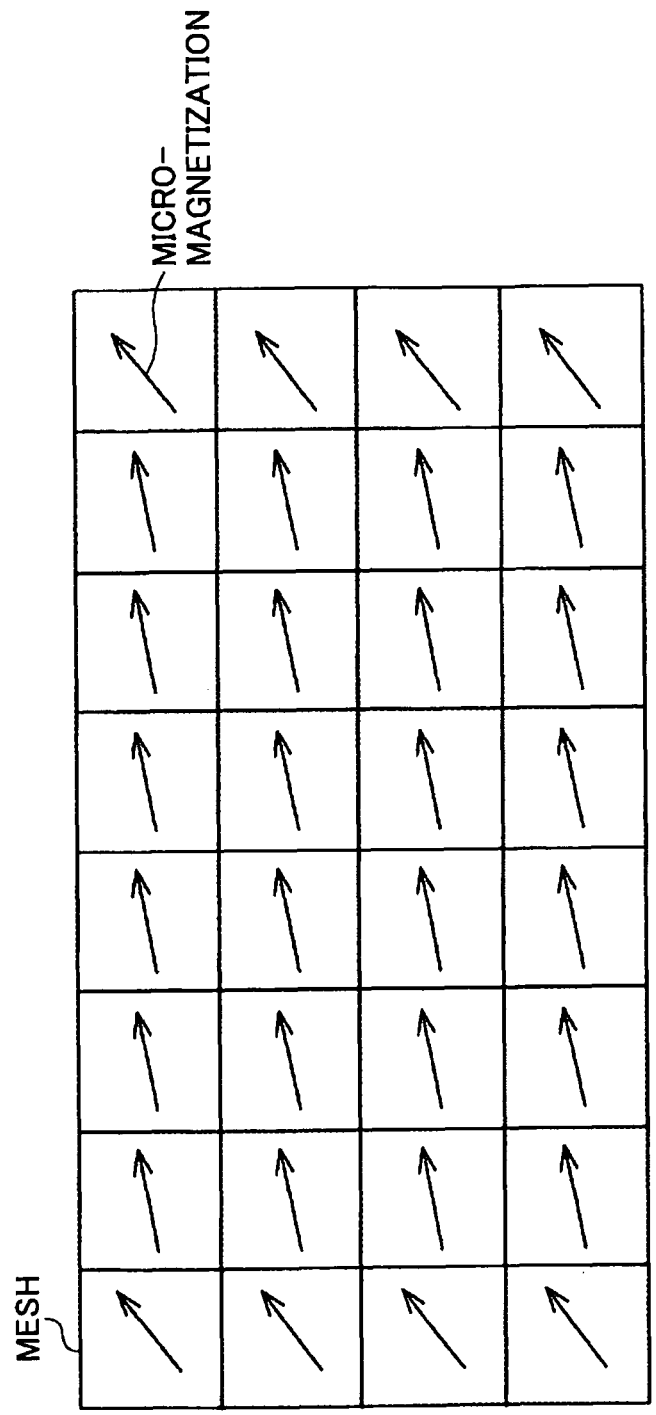
FIG. 1 illustrates an example of a magnetic material model used in a micro-magnetization analysis according to the related art.
Figure 2:
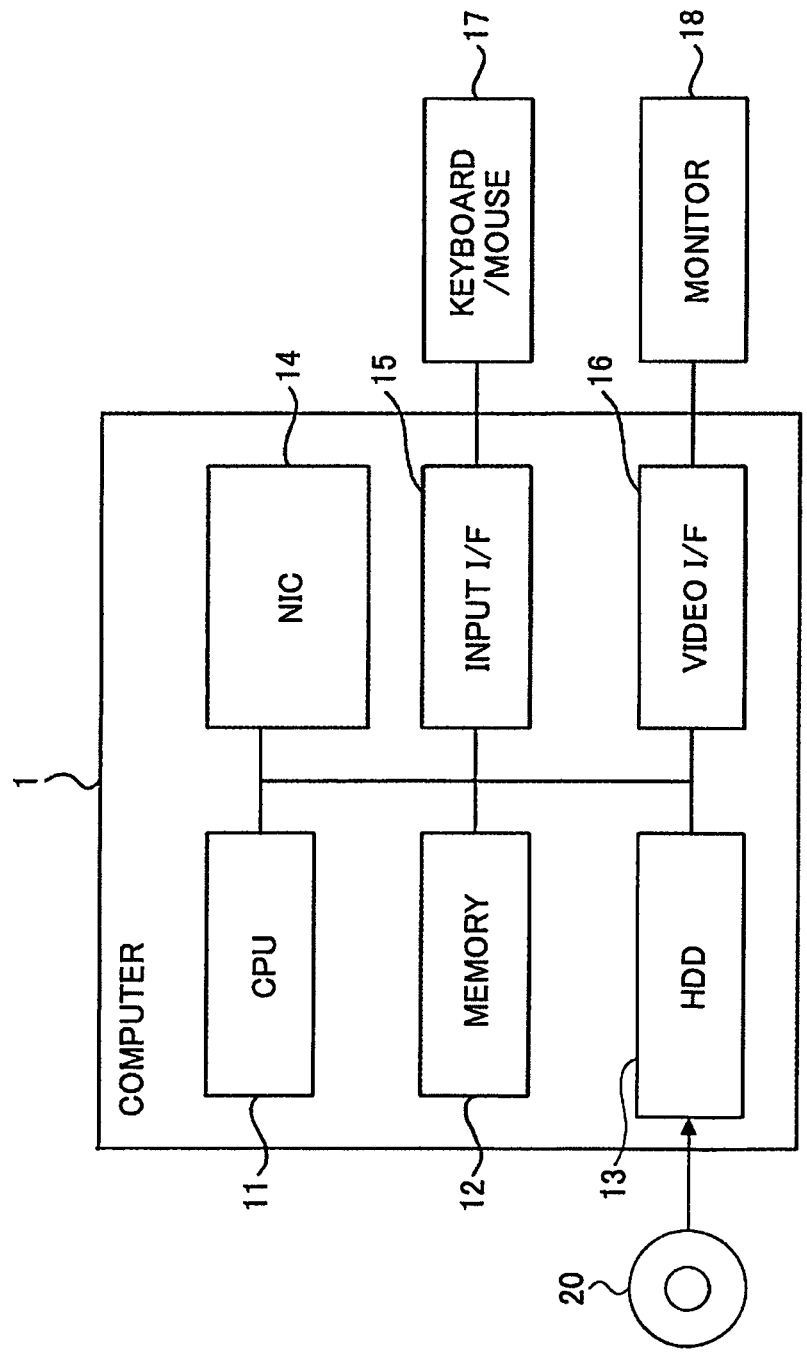
FIG. 2 is a block diagram of a magnetic exchange coupling energy calculating apparatus according to an embodiment of the present invention.

Embodiments of the present invention will be described with reference to the accompanying drawings. FIG. 2 is a block diagram of a computer 1 as an example of a magnetic exchange coupling energy calculating apparatus according to an embodiment. The computer 1 includes a CPU (Central Processing Unit) 11 that controls the overall operation of the computer 1. The CPU 11 may provide an interpolating function and a calculating function. The computer 1 also includes a memory 12 that may provide a working area; a hard disk drive (HDD) 13 that may store an operating system (OS) and a simulation program; a network interface card (NIC) 14; an input interface (I/F) 15; and a video I/F 16.

The CPU 11 is connected to the memory 12, the HDD 13, the NIC 14, the input I/F 15, and the video I/F 16 via a bus or the like. To the input I/F 15, a keyboard and mouse 17 are connected. To the video I/F 16, a monitor 18 is connected. The CPU 11 may read the simulation program from the HDD 13 and execute it in order to perform micro-magnetization analysis utilizing a finite volume method. Data of a magnetic material model used in micro-magnetization analysis may be stored in the HDD 13 in advance. The simulation program may be initially recorded in a non-transitory computer-readable recording medium 20 and later loaded into the HDD 13.

Next, the problem of a decrease in accuracy of calculation of the magnetic exchange coupling energy is discussed with reference to a simple calculation based on two magnetization vectors. When the LLG equation of magnetization vectors according to equation (1) is discretized by the simulation program, the magnetic exchange coupling energy may be expressed by the following:

$$E_{ij} = \int e \, dV \qquad (3)$$
$$= -\int \frac{A}{M_S L^2} (\vec{M}_j - \vec{M}_i)^2 \, dV$$
$$= -\frac{A dS}{M_S L^2} \int_0^L (\vec{M}_j - \vec{M}_i)^2 \, dl$$

where e is a magnetic exchange coupling energy density; A is a magnetic exchange coupling coefficient, M is saturation magnetization per unit volume of magnetic material; L is the distance between adjacent magnetization vectors; $M_i$ is the i-th magnetization vector; dS is a sectional area between adjacent mesh areas; and θ is an angle formed by the adjacent magnetization vectors.

Figure 3:
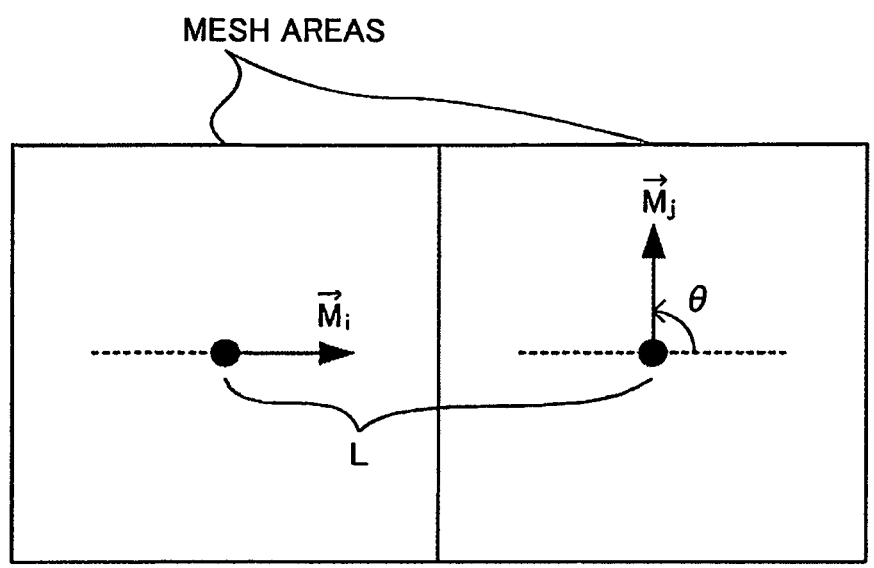
FIG. 3 illustrates an example where two magnetization vectors form an angle of 90°.

When the angle formed by the two magnetization vectors is 90°, as illustrated in FIG. 3, the LLG equation of magnetization vectors according to equation (1) may be discretized in accordance with the simulation program by a related-art technique such that the magnetization vectors are discontinuous between two mesh areas. In this case, the magnetic exchange coupling energy may be expressed by the following:

[METHOD BY DISCRETIZATION] (4)

$$E_{ij} = -\frac{A dS}{M_S^2 L^2} \int_0^L (\vec{M}_j - \vec{M}_i)^2 \, dl$$
$$= -\frac{A dS}{M_S^2 L} (\vec{M}_j - \vec{M}_i)^2$$
$$= -\frac{A dS}{L} (2 - 2\cos\theta)$$
$$= -\frac{2 A dS}{L}$$

Similarly, when the angle formed by the two magnetization vector is 90°, the magnetic exchange coupling energy may be calculated in accordance with the simulation program by integrating magnetization vectors that have been interpolated between two mesh areas. In this case, the magnetic exchange coupling energy may be expressed by equation (5). This calculation formula may be analytically obtained by integrating the area occupied by the two magnetization vectors by the angle θ, on the assumption that the rotation angle of the two magnetization vectors is linearly and continuously varied.

[ANALYTIC METHOD]                                                    (5)

$$E_{ij} = -\frac{AdS}{M_S^2 L^2} \int_0^L (\vec{M}_j - \vec{M}_i)^2 dl$$

$$= -\frac{AdS}{M_S^2 L(\pi/2)} \int_0^{\pi/2} (2 - 2\cos\Theta) d\theta$$

$$= -\frac{2AdS}{M_S^2 L\pi} [2\theta - 2\sin\theta]_0^{\pi/2}$$

$$= -\frac{2AdS}{L}\left(1 - \frac{2}{\pi}\right)$$

The magnetic exchange coupling energy of the former, i.e., equation (4), is lower by about 20% in absolute values than the magnetic exchange coupling energy of the latter, i.e., equation (5). Namely, when the rotation angle of the magnetization vectors is large, such as 90°, an accurate magnetic exchange coupling energy cannot be obtained by the related-art technique.

Figure 4:
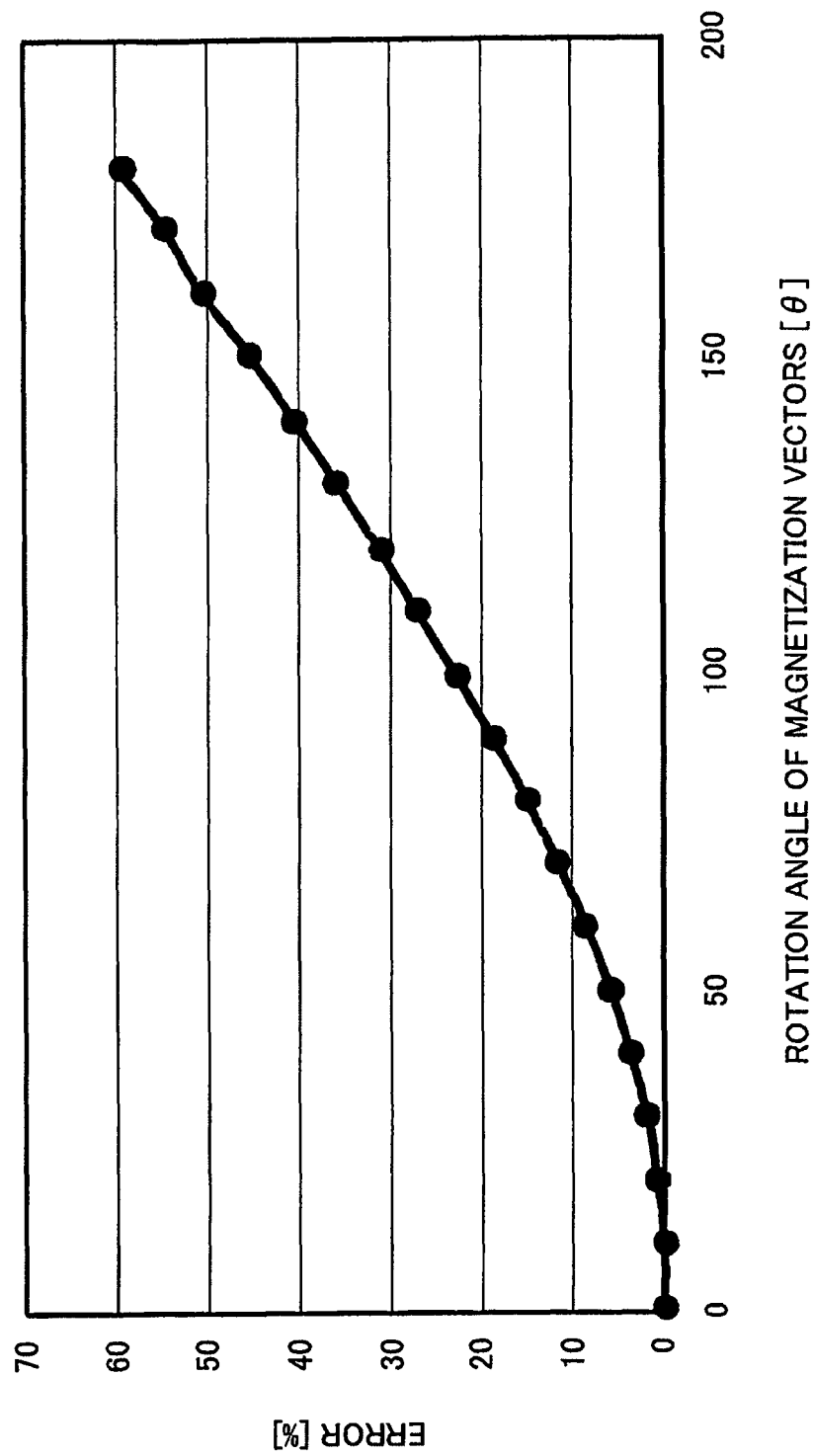
FIG. 4 is a graph plotting an error between the magnetic exchange coupling energy according to equation (4) and that according to equation (5), relative to a rotation angle of magnetization vectors.

FIG. 4 is a graph plotting the error between the magnetic exchange coupling energy according to equation (4) and that according to equation (5), relative to the rotation angle of the magnetization vectors. As illustrated in FIG. 4, the error increases as the rotation angle of the magnetization vectors increases. Namely, when the mesh size is increased (to more than 10 nm, for example), the rotation angle of the magnetization vectors also increases, and therefore the error in magnetic exchange coupling energy also increases.

In accordance with the present embodiment, even when a magnetic material model is created that includes a mesh of a size (such as 30 nm) larger than those of related-art meshes, the area occupied by the two magnetization vectors is integrated (analytical solution) in accordance with the simulation program on the assumption that the rotation angle of the magnetization vectors of the adjacent mesh areas is continuously and linearly varied, thus enabling an accurate calculation of magnetic exchange coupling energy.

Figure 5:
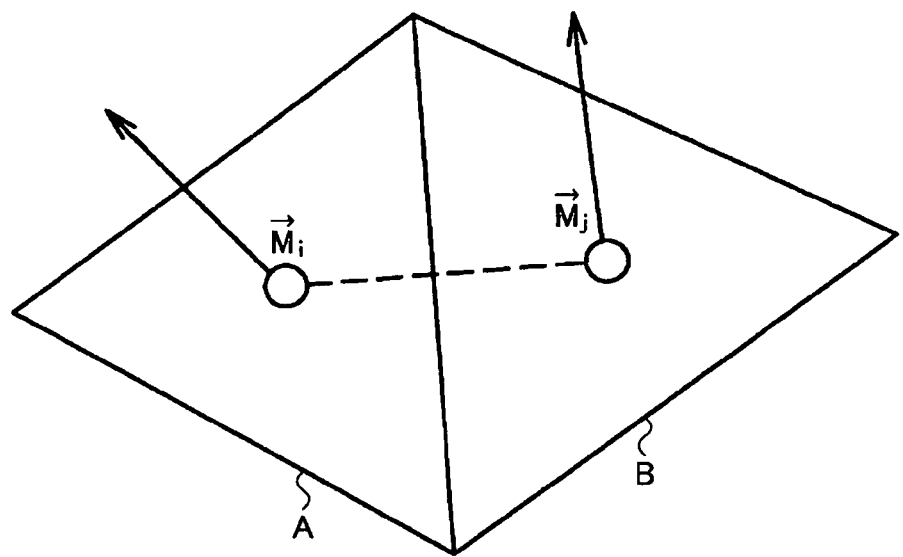
FIG. 5 illustrates two magnetization vectors disposed according to a finite volume method.

Next, a method of accurately calculating the magnetic exchange coupling energy is described in detail. Generally, a discretizing method for micro-magnetization analysis may involve the finite volume method, whereby a magnetization vector is disposed at the center of an element. Although the finite volume method does not involve interpolation functions such as those of the finite element method, an element boundary surface value may be obtained by linearly interpolating the value at the center of the element. FIG. 5 illustrates magnetization vectors $M_i$ and $M_j$ disposed at the respective centers of two adjacent mesh areas A and B (elements) according to the finite volume method. In the following description, the magnetic exchange coupling energy is accurately determined by applying the concept of linear interpolation to the finite volume method in accordance with the simulation program, on the assumption that the rotation angle of the magnetization vectors of adjacent mesh areas is continuously varied.

Figure 6:
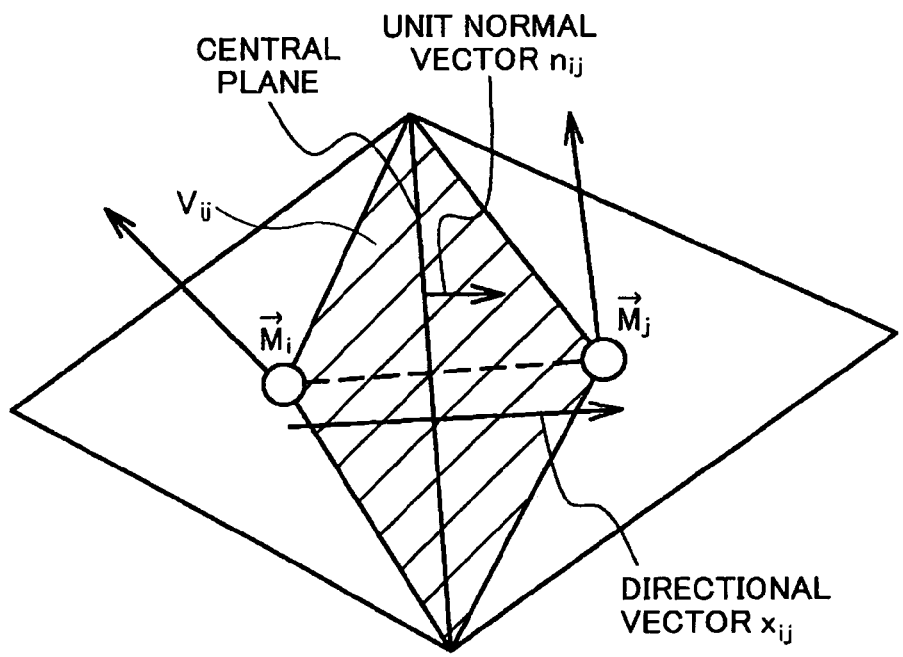
FIG. 6 illustrates a volume occupied by the two adjacent magnetization vectors.

Referring to FIG. 6, the volume $V_{ij}$ occupied by the two adjacent magnetization vectors is illustrated by the area with hatching. The magnetic exchange coupling energy of the area is expressed by the following:

$$E_{ij} = \int e \, dV_{ij} \qquad (6)$$

$$= -\int \frac{A}{M_S L_{ij}^2}(\vec{M}_j - \vec{M}_i)^2 dV_{ij}$$

-continued $$= -\int_0^L \frac{A}{M_S L_{ij}^2}(\vec{M}_j - \vec{M}_i)^2 dS_{ij} dl_{ij}$$

where $dS_{ij}$ is a sectional area between the two mesh areas, and $L_{ij}$ is the distance between the two magnetization vectors. $dV_{ij}$ is expressed by the following equation (7), while $L_{ij}$ is expressed by the following equation (8):

$$dV_{ij} = dS_{ij} dl_{ij} (dl_{ij} = \vec{dx}_{ij} \cdot \vec{dn}_{ij}) \qquad (7)$$

$$L_{ij} = \vec{x}_{ij} \cdot \vec{n}_{ij} \qquad (8)$$

Equation (9) is a related-art equation indicating the magnetic exchange coupling energy between the two magnetization vectors $M_i$ and $M_j$. While equation (9) may be used when the rotation angle of the adjacent magnetization vectors is small (such as 10° or less), equation (9) is associated with the problem of an increase in error in magnetic exchange coupling energy as the rotation angle of the adjacent magnetization vectors is increased.

[RELATED-ART METHOD]                                                 (9)

$$E_{ij} = -\frac{AdS_{ij}}{M_S L_{ij}}(\vec{M}_j - \vec{M}_i)^2$$

Figure 7:
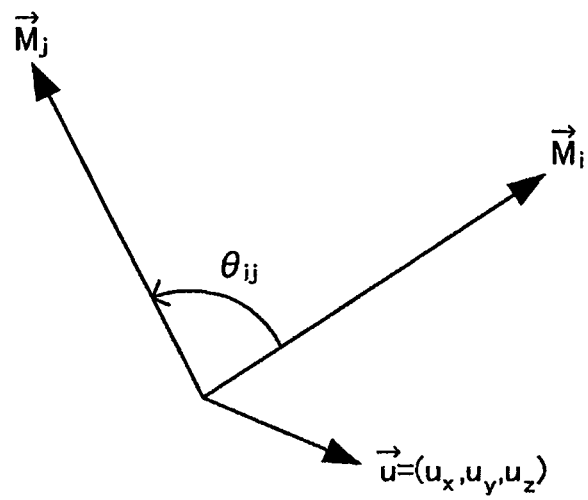
FIG. 7 illustrates a rotation axis u perpendicular to the two magnetization vectors, and a rotation angle θ.

The magnetic exchange coupling energy may be accurately calculated by calculating the angle formed by the two magnetization vectors $M_i$ and $M_j$, integrating the energy of the volume occupied by the two magnetization vectors $M_i$ and $M_j$ by using a linearly interpolated rotation angle, and analytically determining the magnetic exchange coupling energy in accordance with the simulation program. Because the rotation angle is linearly varied, when the angle $\theta$ formed by the two magnetization vectors is equal to or less than $\pi$, the rotation axis u and the rotation angle $\theta$ illustrated in FIG. 7 can be calculated by the following equations (10) and (11), where $M_s$ is the magnitude of the magnetization vector. The rotation axis u corresponds to a vector perpendicular to the two magnetization vectors $M_i$ and $M_j$.

$$u = (u_x, u_y, u_z) = \frac{\vec{M}_i - \vec{M}_j}{M_s^2} \qquad (10)$$

$$\frac{\vec{M}_i - \vec{M}_j}{M_s^2} = \cos\Theta_{ij} \Rightarrow \Theta_{ij} = \arccos\left(\frac{\vec{M}_i - \vec{M}_j}{M_s^2}\right) \ (0 \leq \theta \leq \pi) \qquad (11)$$

When the integral of distance in one dimension of the magnetic exchange coupling energy is variably transformed into the integral of rotation angle, equation (6) may be transformed into equation (12):

$$-\frac{A}{M_S L^2}\int_0^L (\vec{M}_j - \vec{M}_i)^2 dS_{ij} dl_{ij} = -\frac{AdS_{ij}}{M_S L^2}\int_0^L (\vec{M}_j - \vec{M}_i)^2 dl_{ij} \qquad (12)$$

$$= -\frac{AdS_{ij}}{M_S L^2}\int_0^L \left(\frac{\vec{M}_j^2 + \vec{M}_i^2 -}{2\vec{M}_j \cdot \vec{M}_i}\right) dl_{ij}$$

$$= -\frac{ALdS_{ij}}{L^2 \Theta_{ij}}\int_0^\Theta (2 - 2\cos\theta) d\theta$$

-continued $$= -\frac{2AdS_{ij}}{L\Theta_{ij}}\int_0^\Theta (1-\cos\theta)d\theta$$

$$\left(dl_{ij} = \frac{L_{ij}}{\Theta_{ij}}d\theta_{ij}\right)$$

where, when the integral with respect to the angle θ on the right-hand side is analytically calculated in accordance with the simulation program, accurate magnetic exchange coupling energy is expressed by the following:

[ANALYTIC METHOD] $E_{ij} = -\frac{2AdS_{ij}}{L_{ij}\Theta}(\Theta - \sin\Theta)$ (13)

Figure 8:
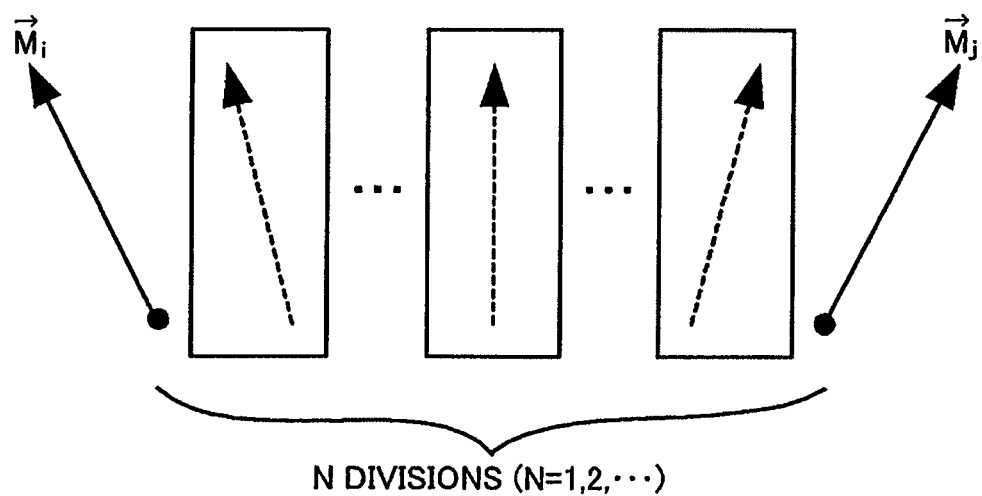
FIG. 8 illustrates an example where the angle formed by the two magnetization vectors is interpolated, and the interval between the two magnetization vectors is divided into N portions.

Equation (13) indicates the result of analytically calculating the magnetic exchange coupling energy in accordance with the simulation program. It is also possible to accurately calculate the magnetic exchange coupling energy by interpolating the angle formed by the magnetization vectors $M_i$ and $M_j$, dividing the integral interval of equation (6) into N portions, and numerically integrating the energy of the volume occupied by the magnetization vectors $M_i$ and $M_j$ in accordance with the simulation program, as illustrated in FIG. 8. Equation (6), when expressed in the form of numerical integration, may be expressed by equation (14), where $M_1$ corresponds to $M_i$ and $M_N$ corresponds to $M_j$; w is a weighting function of a Gaussian integral; and N is the number of divisions of the integral interval, which may be designated by a user.

[NUMERICAL INTEGRATION METHOD] $E_{ij} =$ (14)

$$-\frac{AdS_{ij}}{M_S L_{ij} N}\sum_{n=1}^{N} w_i(\vec{M}_n - \vec{M}_{n+1})^2$$

Figure 9:
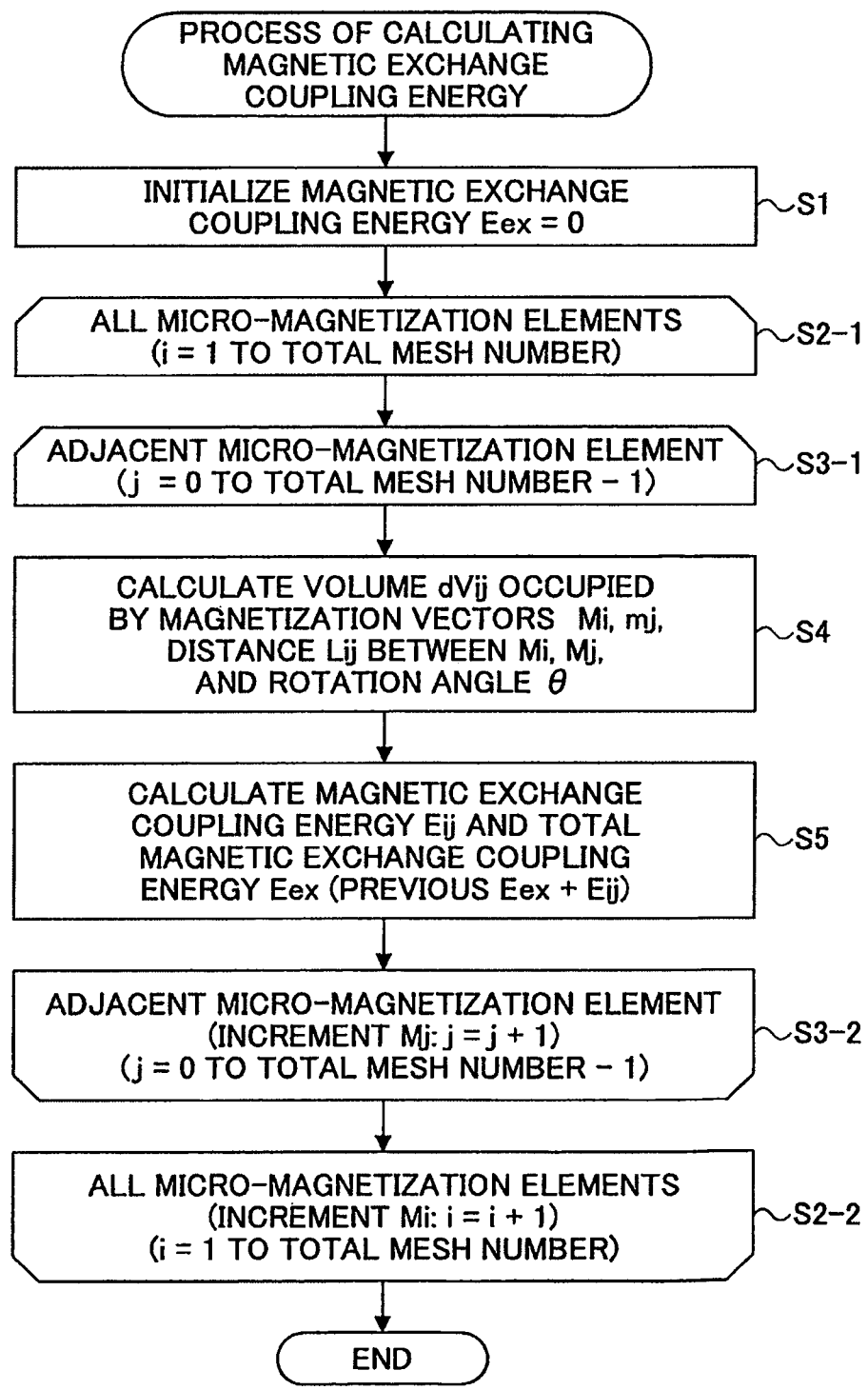
FIG. 9 is a flowchart of a process of calculating magnetic exchange coupling energy.

FIG. 9 is a flowchart of a process of calculating the magnetic exchange coupling energy in accordance with the simulation program. First, the magnetic exchange coupling energy is initialized; namely, the exchange coupling energy $E_{ex}$ is set to 0 (step S1). Next, the value of "i" of the magnetization vector $M_i$ as a calculation target included in the magnetic material model is sequentially incremented from "1" to the total number of mesh areas (the loop between steps S2-1 and S2-2). The timing of incrementing the value of "i" corresponds to the timing of step S2-2 when the processes of steps S4 and S5 are completed, as will be described later. When the value of "i" of the magnetization vector $M_i$ is set equal to the total number of mesh areas, and the processes of steps S4 and S5 are completed, the calculation process is completed.

In accordance with the simulation program, the value of "j" of the magnetization vector $M_j$ adjacent to the magnetization vector $M_i$ as a calculation target included in the magnetic material model is successively incremented from "0" to the total number of mesh areas-1 (the loop between steps S3-1 and S3-2). The timing of incrementing the value of "j" corresponds the timing of step S3-2 when the processes of steps S4 and S5 are completed, as will be described later.

After step S3-1, the volume $dV_{ij}$ occupied by the two magnetization vectors $M_i$ and $M_j$ and the distance $L_{ij}$ between the two magnetization vectors $M_i$ and $M_j$ are calculated in accordance with equations (7) and (8). Also, the rotation angle θ is calculated in accordance with equation (11) (step S4). Thereafter, the magnetic exchange coupling energy $E_{ij}$ is calculated based on the calculated volume $dV_{ij}$, distance $L_{ij}$, and rotation angle θ according to equation (13). The calculated magnetic exchange coupling energy $E_{ij}$ is added to the preceding total of the magnetic exchange coupling energy $E_{ex}$, thus obtaining the total magnetic exchange coupling energy $E_{ex}$ (step S5). In step S5, the magnetic exchange coupling energy $E_{ij}$ is calculated each time the values of "i" or "j" of the magnetization vectors $M_i$ and $M_j$ are incremented.

Preferably, the simulation program may be modified such that the magnetic exchange coupling energy $E_{ij}$ is calculated according to equation (14) in step S5. In accordance with the simulation program, the magnetic exchange coupling field may be calculated by differentiating the magnetic exchange coupling energy $E_{ij}$ with the magnetization vector ($H_{ex,ij} = -\partial E_{ij}/\partial M_i$).

Thus, in accordance with the simulation program, the rotation angle between the two magnetization vectors $M_i$ and $M_j$ disposed at the respective centers of the adjacent elements used in the finite volume method is linearly interpolated with reference to the rotation axis u perpendicular to the two magnetization vectors $M_i$ and $M_j$, and the energy of the volume V occupied by the two magnetization vectors $M_i$ and $M_j$ is integrated by the linearly interpolated rotation angle, thus calculating the magnetic exchange coupling energy. Thus, the magnetic exchange coupling energy can be calculated more accurately than is possible with related-art methods. Thus, the computer 1 may act as an interpolating unit and a magnetic exchange coupling energy calculating unit by executing the simulation program.

Preferably, the simulation program may be modified such that the rotation angle between the two magnetization vectors $M_i$ and $M_j$ is interpolated, the interval between the two magnetization vectors $M_i$ and $M_j$ is divided into plural areas, and the energy of the volume V occupied by the two magnetization vectors $M_i$ and $M_j$ is numerically integrated for each divided area. In this way, the magnetic exchange coupling energy can be calculated more accurately than is possible with related-art methods.

Preferably, the simulation program may be modified such that the magnetic exchange coupling field obtained by differentiating the calculated magnetic exchange coupling energy with the magnetization vector is used as the magnetic exchange coupling field included in the effective magnetic field of the LLG equation, so that a highly accurate micromagnetization analysis can be realized.

Next, a method of accurately calculating the magnetic exchange coupling field is described. In the LLG equation of micro-magnetization, the magnetic field due to a magnetic exchange coupling that acts as a force exerted on micromagnetization vectors is expressed by equation (15):

$$\vec{H}_{ex,ij} = -\frac{\partial E_{ij}}{\partial \vec{M}_i} \quad (15)$$

$$= \int \frac{2A}{M_S L^2}(\vec{M}_j - \vec{M}_i)dV_{ij}$$

$$= \frac{2AdS_{ij}}{M_S L^2}\int_0^L (\vec{M}_j - \vec{M}_i)dl_{ij}$$

In a related-art method, the magnetic exchange coupling field may be calculated according to equation (16) based on a calculation approximating $dl_{ij}$ as L:

[RELATED-ART METHOD] $\vec{H}_{ex,ij} \approx \dfrac{2AdS_{ij}}{M_S L}(\vec{M}_j - \vec{M}_i)$ (16)

Such an approximate calculation is associated with the problem that as the rotation angle of the magnetization vectors increases, the calculation accuracy decreases. In order to more accurately calculate the magnetic field due to magnetic exchange coupling, integration may be preferably performed analytically in accordance with the simulation program.

According to the analytical calculation according to equation (15), integration is performed with the angle θ of rotation about the rotation axis of the two magnetization vectors $M_i$ and $M_j$. The rotation axis u perpendicular to the two magnetization vectors $M_i$ and $M_j$ is expressed by equation (17) using a vector product. By rotating the magnetization vector $M_i$ about the rotation axis u, the magnetization vector $M_j$ can be expressed as a function of the rotation angle, so that analytical integration can be performed based on the rotation angle. A transform matrix $T(M_i \to M_j)$ that rotates the magnetization vector $M_i$ about the rotation axis u by θ is expressed by equation (18), where $I_{ij}$ is the unit matrix, while a transform equation for the magnetization vector $M_j$ is expressed by equation (19):

$$u = \dfrac{\vec{M}_i \times \vec{M}_j}{M_S^2} = (u_x, u_y, u_z) \quad (17)$$

$$T_{ij}(\theta) = I_{ij}\cos\theta + (1-\cos\theta)u_i u_j + \sin\theta \begin{pmatrix} 0 & -u_z & u_y \\ u_z & 0 & -u_x \\ -u_y & u_x & 0 \end{pmatrix} \quad (18)$$

$$\vec{M}_j = T_{ij}(\theta)\vec{M}_i \quad (19)$$

The amount of change in the magnetization vectors, when expressed by a transform matrix T, is expressed by equation (20):

$$\vec{M}_j - \vec{M}_i = (T_{ij}(\theta) - 1)M_i \quad (20)$$

$$= \left\{ I_j(\cos\theta - 1) + (1-\cos\theta)u_i u_j + \sin\theta \begin{pmatrix} 0 & -u_z & u_y \\ u_z & 0 & -u_x \\ -u_y & u_x & 0 \end{pmatrix} \right\} \vec{M}_i.$$

When, in accordance with the simulation program, the magnetic exchange coupling field of equation (15) is analytically integrated by using equation (20), equation (21) is obtained, where, in accordance with the simulation program, the integral of distance in one dimension of the magnetic exchange coupling field according to equation (15) is variably transformed into the integral of the rotation angle θ.

[ANALYTIC METHOD] $\vec{H}_{ex,ij} = \dfrac{2AdS_{ij}}{M_S L\Theta_{ij}}\vec{M}_i$ (21)

$$\int_0^\Theta (T_{ij}(\theta) - 1)d\theta$$

$$= \dfrac{2AdS_{ij}}{M_S L\Theta_{ij}}\tau_{ij}(\Theta_{ij})\vec{M}_i$$

where $\tau_{ij}$ is expressed by equation (22):

$$\tau_{ij}(\Theta_{ij}) = \left\{ \begin{array}{l} I_{ij}(\sin\Theta_{ij} - \Theta_{ij}) + (-\sin\Theta_{ij} + \Theta_{ij})u_i u_j + \\ (1-\cos\Theta_{ij})\begin{pmatrix} 0 & -u_z & u_y \\ u_z & 0 & -u_x \\ -u_y & u_x & 0 \end{pmatrix} \end{array} \right\} \quad (22)$$

The magnetic exchange coupling field can be more accurately calculated by using equations (21) and (22) in accordance with the simulation program than is possible with the related-art equation (16).

Equations (21) and (22) indicate the result of analytically integrating the magnetic exchange coupling field. Alternatively, the magnetic exchange coupling field may also be accurately calculated by modifying the simulation program such that the angle formed by the magnetization vectors $M_i$ and $M_j$ is interpolated, the integral interval of equation (15) is divided into N portions, and the magnetic field that acts as a force exerted on the micro-magnetization vectors is numerically integrated. Equation (15), when expressed in the form of numerical integration, may yield equation (23), where $M_1$ corresponds to $M_i$, $M_N$ corresponds to $M_j$, and w indicates a weighting function of a Gaussian integral. The number N of divisions of the integral interval may be designated by the user.

$$\vec{H}_{ex,ij} = \dfrac{2AdS_{ij}}{M_S L_{ij} N} \sum_{n=1}^{N-1} w_i(\vec{M}_n - \vec{M}_{n+1}) \quad (23)$$

In accordance with the simulation program, highly accurate micro-magnetization analysis can be performed by using the value of equation (21), which is an analytical solution, or the value of equation (23), which is obtained by numerical integration, as the magnetic exchange coupling field; namely the effective magnetic field of the LLG equation.

Figure 10:
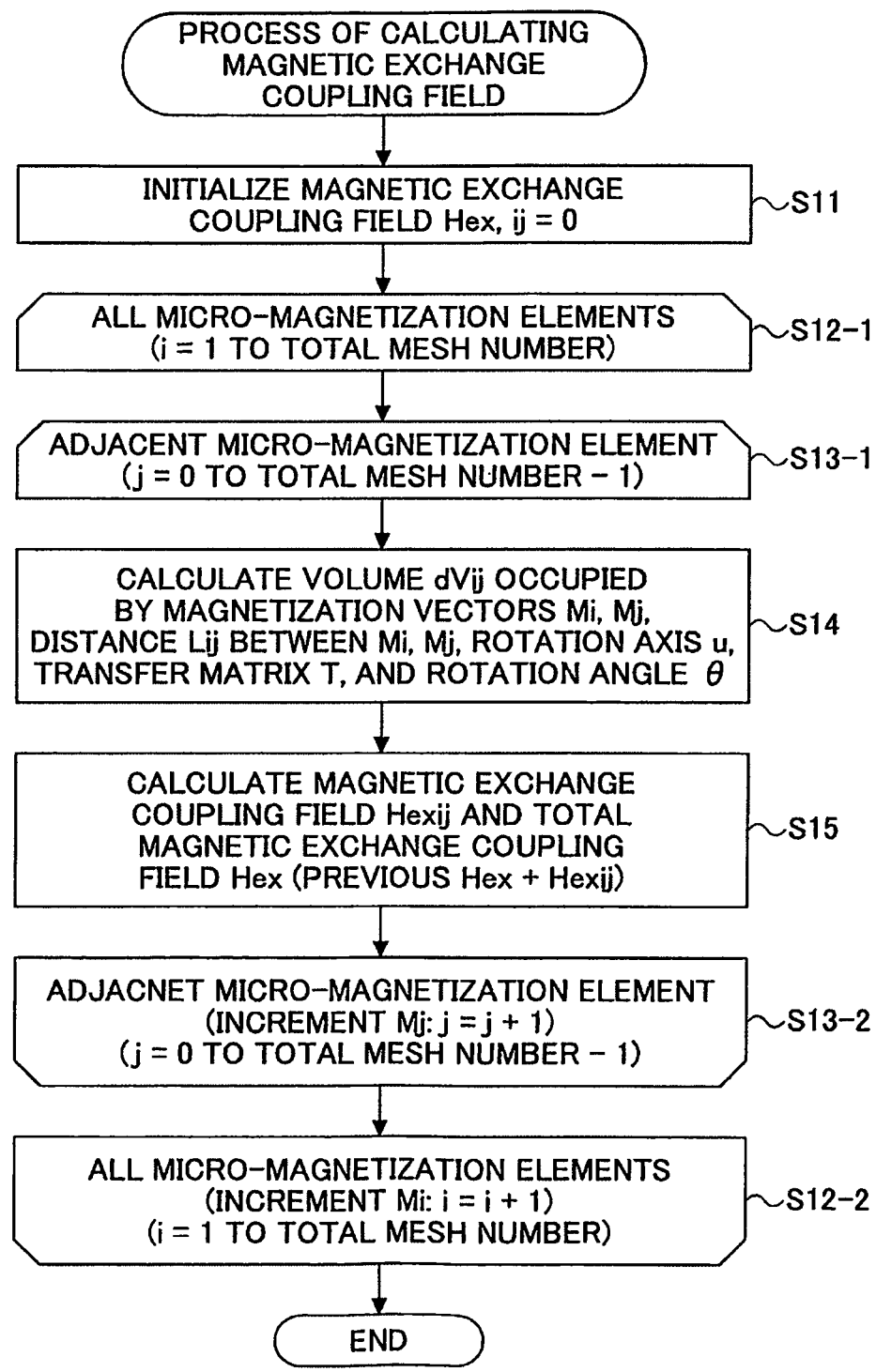
FIG. 10 is a flowchart of a process of calculating a magnetic exchange coupling field.

FIG. 10 is a flowchart of a process of calculating the magnetic exchange coupling field according to the simulation program. First, in accordance with the simulation program, the magnetic exchange coupling field is initialized; namely, the magnetic exchange coupling field $H_{ex,ij}$ is set to 0 (step S11). Then, the value of "i" of the magnetization vector $M_i$ as a calculation target included in the magnetic material model is successively incremented from "1" to the total number of mesh areas (the loop between steps S12-1 and S12-2). The timing of incrementing the value of "i" corresponds to the timing of S12-2 when the processes of steps S14 and S15 are completed. When the value of "i" of the magnetization vector Mi is set equal to the total number of mesh areas and the processes of steps S14 and S15 are completed, the calculation process is completed.

In accordance with the simulation program, the value of "j" of the magnetization vector $M_j$ included in the magnetic material model adjacent the magnetization vector $M_i$ as a calculation target is successively incremented from "0" to the total number of mesh areas-1 (the loop between steps S13-1 and S13-2). The timing of incrementing the value of "j"

corresponds to the timing of S13-2 when the processes of steps S14 and S15 are completed, as will be described later.

After step S13-1, the volume $dV_{ij}$ occupied by the two magnetization vectors $M_i$ and $M_j$ and the distance $L_{ij}$ between the two magnetization vectors $M_i$ and $M_j$ are calculated according to equations (7) and (8). Also, the rotation axis u and the transform matrix T are calculated according to equations (17) and (18). Further, the rotation angle $\theta$ is calculated according to equation (11) (step S14). Thereafter, the magnetic exchange coupling field $H_{ex,ij}$ is calculated according to equations (21) and (22) using the calculated volume $dV_{i,j}$, distance $L_{ij}$, rotation axis u, transform matrix T, and rotation angle $\theta$, in accordance with the simulation program.

The calculated magnetic exchange coupling field $H_{ex,ij}$ is added to the preceding total of the magnetic exchange coupling field $H_{ex}$, thus obtaining the total magnetic exchange coupling field $H_{ex}$ (step S15). In step S15, in accordance with the simulation program, the magnetic exchange coupling field $H_{ex,ij}$ is calculated each time the values of "i" or "j" of the magnetization vectors $M_i$ and $M_j$ are incremented. The simulation program may be modified such that in step S15, the magnetic exchange coupling field $H_{ex,ij}$ is calculated according to equation (23).

Thus, in accordance with the simulation program, the rotation angle between the two magnetization vectors $M_i$ and $M_j$ disposed at the respective centers of the adjacent elements used in the finite volume method are linearly interpolated with reference to the rotation axis u perpendicular to the two magnetization vectors $M_i$ and $M_j$, and the magnetic field that acts as a force exerted on the two magnetization vectors $M_i$ and $M_j$ is integrated with the linearly interpolated rotation angle to calculate the magnetic exchange coupling field. In this way, the magnetic exchange coupling field can be calculated more accurately than is possible with related-art methods.

Preferably, in accordance with the simulation program, the rotation angle between the two magnetization vectors $M_i$ and $M_j$ are interpolated, the interval between the two magnetization vectors $M_i$ and $M_j$ are divided into plural areas, and the magnetic field that acts as a force exerted on the two magnetization vectors $M_i$ and $M_j$ are numerically integrated for each divided area in order to calculate the magnetic exchange coupling field. In this way, the magnetic exchange coupling field may be calculated more accurately than is possible with related-art methods.

Preferably, in accordance with the simulation program, the calculated magnetic exchange coupling field may be used as the magnetic exchange coupling field included in the effective magnetic field of the LLG equation. In this way, highly accurate micro-magnetization analysis may be realized.

The simulation program used in accordance with an embodiment may include application software for magnetic simulation involving micro-magnetization. The micro-magnetization analysis according to an embodiment may be applied to a HDD magnetic head, a MRAM (Magnetoresistive Random Access Memory), or a micro-motor.

EXAMPLE

Figure 11:
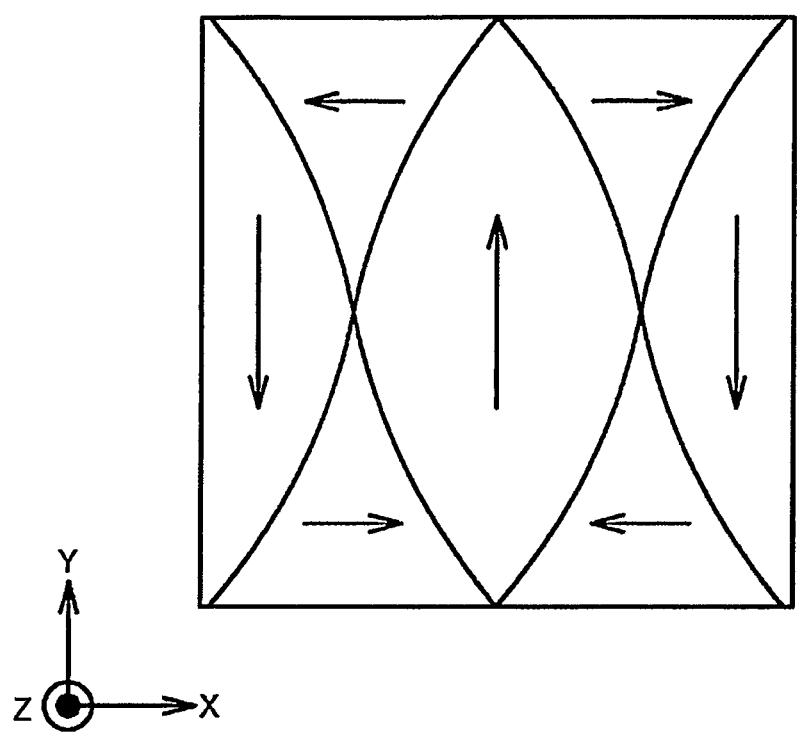
FIG. 11 illustrates a solution of magnetic domain state.

A micro-magnetization analysis was conducted by using the magnetic exchange coupling field calculated by the above method as the exchange-coupling magnetic field of the effective magnetic field of the LLG equation. In this micro-magnetization analysis, under the following model conditions (including magnetic material size and material characteristics), it was determined whether the magnetic domain state is similar before and after varying the mesh size of the magnetic material model. FIG. 11 illustrates a solution of the magnetic domain state.

(Model Conditions)
Size of magnetic material area (X×Y×Z): 500 nm×500 nm×10 nm
Magnitude of magnetization Ms: 8E+5 (A/m)
Anisotropic magnetic field Ku: 5E+2 (J/m$^3$)
Magnetic exchange coupling coefficient A: 1.3E-11 (J/m)
Attenuation coefficient $\alpha$: 1

Figure 12A:
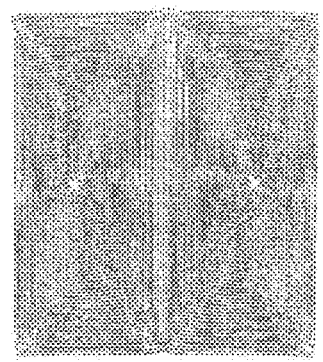
FIGS. 12A, 12B, and 12C illustrate results of a micro-magnetization analysis in which a magnetic material model is divided by a mesh size of 10 nm.
Figure 12B:
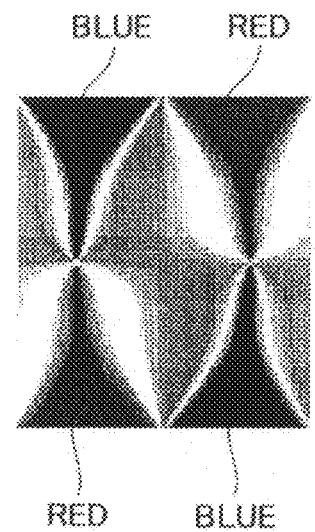
Figure 12C:
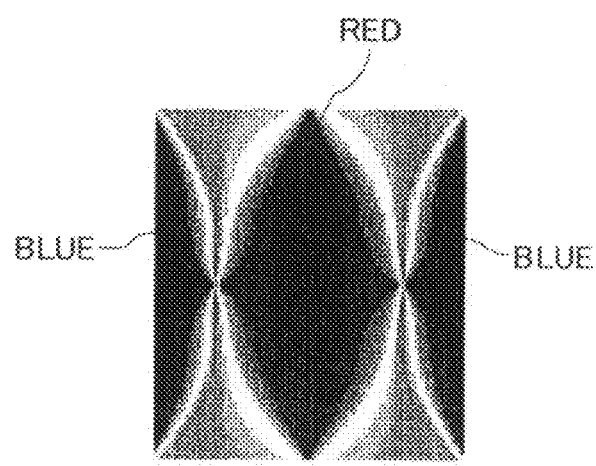

FIGS. 12A through 12C illustrate the results of the micro-magnetization analysis in which the magnetic material model was divided by a mesh size of 10 nm. FIG. 12A illustrates a magnetization vector state. FIG. 12B illustrates the X-axis direction components of the magnetization vectors. FIG. 12C illustrates the Y-axis direction components of the magnetization vectors. In FIGS. 12B and 12C, the red portions indicate components of the plus-direction and the blue portions indicate components of the minus-direction. As illustrated, when the magnetic material model is divided by the mesh size of 10 nm, a magnetic domain state similar to the solution illustrated in FIG. 11 is obtained.

Figure 13A:
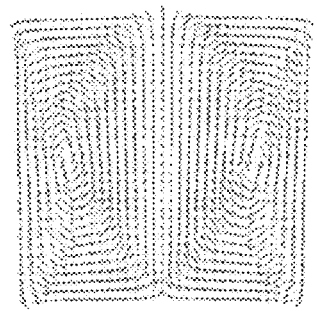
FIGS. 13A, 13B, and 13C illustrate results of a micro-magnetization analysis in which the magnetic material model is divided by a mesh size of 30 nm.
Figure 13B:
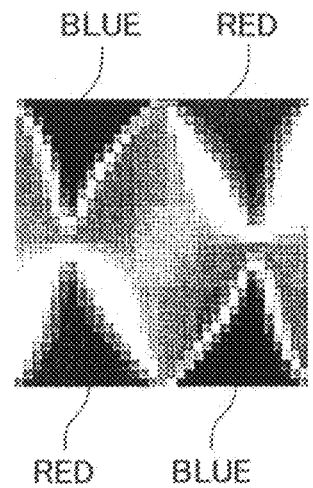
Figure 13C:
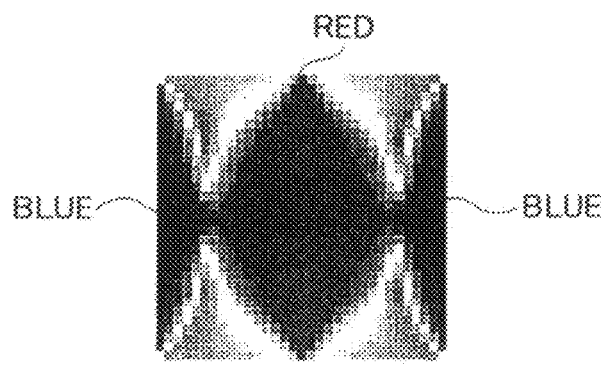

FIGS. 13A through 13C illustrate the results of the micro-magnetization analysis in which the magnetic material model was divided by the mesh size of 30 nm. FIG. 13A illustrates a magnetization vector state. FIG. 13B illustrates the X-axis direction components of the magnetization vectors. FIG. 13C illustrates the Y-axis direction components of the magnetization vectors. In FIGS. 13B and 13C, the red portions indicate components of the plus-direction, while the blue portions indicate components of the minus-direction. While discontinuities may be seen in the rotation of the magnetization vectors as illustrated in FIG. 13A, a magnetic domain state similar to the solution of FIG. 11 is obtained as in the case of the result for the mesh size of 10 nm.

Thus, similar magnetic domain states can be obtained even when the mesh size is increased (such as from 10 nm to 30 nm, for example), indicating that the above-described method of calculating the magnetic exchange coupling field is effective. Further, even when the mesh size is increased (such as from 10 nm to 30 nm, for example), an accurate micro-magnetization analysis can be performed. When the mesh size is trebled, for example, the degrees of freedom of the LLG equation may be reduced to about $\frac{1}{27}$, thus contributing to the decrease (about $\frac{1}{27}$) in memory resource required for calculations. Such an increase in mesh size also contributes to the decrease in calculation time (about $\frac{1}{27}$).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium storing a program configured to cause a computer to perform a magnetic exchange coupling energy calculating process, the magnetic exchange coupling energy calculating process comprising:

linearly interpolating a rotation angle between two magnetization vectors disposed at the respective centers of two adjacent elements used in a finite volume method, the rotation angle between the two magnetization vectors being linearly interpolated with reference to a rotation axis that is shared by the two magnetization vectors and perpendicular to the two magnetization vectors that rotate about the rotation axis; and calculating a magnetic exchange coupling field by integrating a magnetic field acting as a force exerted on the two magnetization vectors with the linearly interpolated rotation angle.

2. The non-transitory computer-readable medium according to claim 1, wherein the magnetic exchange coupling energy calculating process further comprises:

calculating the magnetic exchange coupling field in accordance with equations (i) and (ii) obtained by integrating the magnetic field acting as a force exerted on the two magnetization vectors with the linearly interpolated rotation angle:

$$\vec{H}_{ex,ij} = \frac{2AdS_{ij}}{M_S L \Theta_{ij}} \tau_{ij}(\Theta_{ij})\vec{M}_i \quad (i)$$

$$\tau_{ij}(\Theta_{ij}) = \left\{ I_{ij}(\sin\Theta_{ij} - \Theta_{ij}) + (-\sin\Theta_{ij} + \Theta_{ij})u_i u_j + (1-\cos\Theta_{ij})\begin{pmatrix} 0 & -u_z & u_y \\ u_z & 0 & -u_x \\ -u_y & u_x & 0 \end{pmatrix} \right\} \quad (ii)$$

where $H_{ex,ij}$ is the magnetic exchange coupling field, A is a magnetic exchange coupling coefficient, $dS_{ij}$ is a sectional area between the two elements, $M_s$ is a saturation magnetization per unit volume, L is a distance between the two magnetization vectors, $\theta_{ij}$ is the linearly interpolated rotation angle, $I_{ij}$ is a unit matrix, $u_i$ and $u_j$ are a rotation axis perpendicular to the two magnetization vectors, $u_x$, $u_y$, and $u_z$ are vector components of the rotation axis, and $M_i$ is one of the two magnetization vectors.

3. The non-transitory computer-readable medium according to claim 1, wherein the magnetic exchange coupling energy calculating process further comprises:

dividing an interval between the two magnetization vectors into plural areas; and calculating the magnetic exchange coupling field by subjecting the magnetic field acting as a force exerted on the two magnetization vectors to numerical integration in each of the divided plural areas.

4. The non-transitory computer-readable medium according to claim 3, wherein the magnetic exchange coupling energy calculating process further comprises:

calculating the magnetic exchange coupling field in accordance with an equation (iii) by which the interval between the two magnetization vectors is divided into plural areas and the magnetic field acting as a force exerted on the two magnetization vectors is subjected to numerical integration in each of the divided plural areas:

$$\vec{H}_{ex,ij} = \frac{2AdS_{ij}}{M_S L_{ij} N} \sum_{n=1}^{N-1} w_i (\vec{M}_n - \vec{M}_{n+1}) \quad (iii)$$

where $H_{ex,ij}$ is the magnetic exchange coupling field, A is a magnetic exchange coupling coefficient, $dS_{ij}$ is a sectional area between two elements, $M_s$ is a saturation magnetization per unit volume, $L_{ij}$ is a distance between the two magnetization vectors, N is a number of divisions, $w_i$ is a weighting function of a Gaussian integral, and $M_n$ and $M_{n+1}$ are the two adjacent magnetization vectors.

5. The non-transitory computer-readable medium according to claim 1, wherein the program causes the computer to perform micro-magnetization analysis by using the calculated magnetic exchange coupling field as an exchange-coupling magnetic field included in an effective magnetic field of a LLG (Landau-Lifshitz-Gilbert) equation.

6. A non-transitory computer-readable recording medium storing a program configured to cause a computer to perform a magnetic exchange coupling energy calculating process, the magnetic exchange coupling energy calculating process comprising:

linearly interpolating a rotation angle between two magnetization vectors disposed at the respective centers of two adjacent elements used in a finite volume method, the rotation angle between the two magnetization vectors being linearly interpolated with reference to a rotation axis that is shared by the two magnetization vectors and perpendicular to the two magnetization vectors that rotate about the rotation axis; and calculating a magnetic exchange coupling energy by integrating the energy of a volume occupied by the two magnetization vectors with the linearly interpolated rotation angle.

7. The non-transitory computer-readable medium according to claim 6, wherein the magnetic exchange coupling energy calculating process further comprises:

calculating the magnetic exchange coupling energy according to an equation (iv) obtained by integrating the energy of the volume occupied by the two magnetization vectors with the linearly interpolated rotation angle:

$$E_{ij} = -\frac{2AdS_{ij}}{L_{ij}\Theta}(\Theta - \sin\Theta) \quad (iv)$$

wherein $E_{ij}$ is the magnetic exchange coupling energy, A is a magnetic exchange coupling coefficient, $dS_{ij}$ is a sectional area between the two elements, $L_{ij}$ is a distance between the two magnetization vectors, and $\theta$ is the linearly interpolated rotation angle.

8. The non-transitory computer-readable medium according to claim 6, wherein the magnetic exchange coupling energy calculating process further comprises:

dividing an interval between the two magnetization vectors into plural areas; and calculating the magnetic exchange coupling energy by subjecting the energy of the volume occupied by the two magnetization vectors to numerical integration in each of the divided plural areas.

9. The non-transitory computer-readable medium according to claim 8, wherein the magnetic exchange coupling energy calculating process further comprises:

calculating the magnetic exchange coupling energy in accordance with an equation (v) by which the interval between the two magnetization vectors is divided into plural areas and the energy of the volume occupied by the two magnetization vectors is subjected to numerical integration:

$$E_{ij} = -\frac{AdS_{ij}}{M_S L_{ij} N} \sum_{n=1}^{N} w_i (\vec{M}_n - \vec{M}_{n+1})^2 \quad \text{(v)}$$

where $E_{ij}$ is the magnetic exchange coupling energy, A is a magnetic exchange coupling coefficient, $dS_{ij}$ is a sectional area between the two elements, $M_s$ is a saturation magnetization per unit volume, $L_{ij}$ is a distance between the two magnetization vectors, N is a number of divisions, $w_i$ is a weighting function of a Gaussian integral, and $M_n$ and $M_{n+1}$ are the two adjacent magnetization vectors.

10. A magnetic exchange coupling energy calculating method comprising:
   linearly interpolating a rotation angle between two magnetization vectors disposed at the respective centers of two adjacent elements used in a finite volume method, the rotation angle between the two magnetization vectors being linearly interpolated with reference to a rotation axis that is shared by the two magnetization vectors and perpendicular to the two magnetization vectors that rotate about the rotation axis; and
   calculating, using a processor, a magnetic exchange coupling field by integrating a magnetic field acting as a force exerted on the two magnetization vectors with the linearly interpolated rotation angle.

11. The magnetic exchange coupling energy calculating method according to claim 10, further comprising:
   dividing an interval between the two magnetization vectors into plural areas; and
   calculating the magnetic exchange coupling field by subjecting the magnetic field acting as a force exerted on the two magnetization vectors to numerical integration in each of the divided plural areas.

12. The magnetic exchange coupling energy calculating method according to claim 10, further comprising:
   performing micro-magnetization analysis by using the calculated magnetic exchange coupling field as an exchange-coupling magnetic field included in an effective magnetic field of a LLG (Landau-Lifshitz-Gilbert) equation.

13. A magnetic exchange coupling energy calculating method comprising:
   linearly interpolating a rotation angle between two magnetization vectors disposed at the respective centers of two adjacent elements used in a finite volume method, the rotation angle between the two magnetization vectors being linearly interpolated with reference to a rotation axis that is shared by the two magnetization vectors and perpendicular to the two magnetization vectors that rotate about the rotation axis; and
   calculating, using a processor, a magnetic exchange coupling energy by integrating the energy of a volume occupied by the two magnetization vectors with the linearly interpolated rotation angle.

14. The magnetic exchange coupling energy calculating method according to claim 13, further comprising:
   dividing an interval between the two magnetization vectors into plural areas; and
   calculating the magnetic exchange coupling energy by subjecting the energy of the volume occupied by the two magnetization vectors to numerical integration in each of the divided plural areas.

15. A magnetic exchange coupling energy calculating apparatus comprising:
   an interpolating unit configured to linearly interpolate a rotation angle between two magnetization vectors disposed at the respective centers of two adjacent elements used in a finite volume method, the rotation angle between the two magnetization vectors being linearly interpolated with reference to a rotation axis that is shared by the two magnetization vectors and perpendicular to the two magnetization vectors that rotate about the rotation axis, and
   a calculating unit configured to calculate a magnetic exchange coupling field by integrating a magnetic field acting as a force exerted on the two magnetization vectors with the linearly interpolated rotation angle.

16. The apparatus according to claim 15, wherein the calculating unit calculates a magnetic exchange coupling energy by integrating the energy of a volume occupied by the two magnetization vectors with the linearly interpolated rotation angle.

* * * * *

UNITED STATES PATENT AND TRADEMARK OFFICE
CERTIFICATE OF CORRECTION

| | | |
|---|---|---|
| PATENT NO. | : 8,798,948 B2 | |
| APPLICATION NO. | : 13/067245 | |
| DATED | : August 5, 2014 | |
| INVENTOR(S) | : Koichi Shimizu | |

It is certified that error appears in the above-identified patent and that said Letters Patent is hereby corrected as shown below:

In the Claims

Column 16, Line 41, In Claim 16, delete "the energy" and insert -- an energy --, therefor.

Signed and Sealed this
Fourth Day of November, 2014

Michelle K. Lee
*Deputy Director of the United States Patent and Trademark Office*